US012615871B2

(12) United States Patent
Jeong et al.

(10) Patent No.: US 12,615,871 B2
(45) Date of Patent: Apr. 28, 2026

(54) IMAGE SENSING DEVICE INCLUDING THROUGH SILICON VIA (TSV) STRUCTURE

(71) Applicant: SK hynix Inc., Icheon-si (KR)

(72) Inventors: In Chul Jeong, Icheon-si (KR); Moung Seok Baek, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 398 days.

(21) Appl. No.: 18/177,625

(22) Filed: Mar. 2, 2023

(65) Prior Publication Data

US 2024/0021647 A1 Jan. 18, 2024

(30) Foreign Application Priority Data

Jul. 13, 2022 (KR) ........................ 10-2022-0086131

(51) Int. Cl.
*H10F 39/00* (2025.01)
*H10F 39/18* (2025.01)
(52) U.S. Cl.
CPC .......... *H10F 39/811* (2025.01); *H10F 39/011* (2025.01); *H10F 39/182* (2025.01); *H10F 39/8053* (2025.01); *H10F 39/8063* (2025.01); *H10F 39/809* (2025.01)
(58) Field of Classification Search
CPC ............. H01L 23/481; H01L 21/76898; H10F 39/809; H10F 39/811
See application file for complete search history.

(56) References Cited

U.S. PATENT DOCUMENTS

| | | | |
|---|---|---|---|
| 10,546,779 B2 | 1/2020 | Zhang et al. | |
| 2008/0197388 A1* | 8/2008 | Park ...................... | H10F 39/807 |
| | | | 257/292 |
| 2011/0220970 A1 | 9/2011 | Komatsu et al. | |
| 2018/0122698 A1* | 5/2018 | Zhang .............. | H01L 21/76844 |
| 2020/0194441 A1 | 6/2020 | Kwon et al. | |
| 2022/0109019 A1* | 4/2022 | Cheng ................... | H10F 39/024 |

FOREIGN PATENT DOCUMENTS

| | | |
|---|---|---|
| JP | 6222989 B2 | 11/2017 |
| KR | 20070087854 A | 8/2007 |
| KR | 20150105076 A | 9/2015 |
| KR | 102355551 B1 | 1/2022 |

* cited by examiner

*Primary Examiner* — Brian Turner

(74) *Attorney, Agent, or Firm* — Perkins Coie LLP

(57) ABSTRACT

An image sensing device includes a semiconductor substrate, an insulation layer disposed below the semiconductor substrate, a through hole formed to extend to the inside of the insulation layer while penetrating the semiconductor substrate, a through silicon via (TSV) structure formed along an inner surface of the through hole, and a photoresist formed over the TSV to gap-fill at least a portion of the through hole.

19 Claims, 12 Drawing Sheets

IMAGE SENSING DEVICE INCLUDING THROUGH SILICON VIA (TSV) STRUCTURE

CROSS-REFERENCE TO RELATED APPLICATION

This patent document claims the priority and benefits of Korean patent application No. 10-2022-0086131, filed on Jul. 13, 2022, which is incorporated by reference in its entirety as part of the disclosure of this patent document.

TECHNICAL FIELD

The technology and implementations disclosed in this patent document generally relate to an image sensing device including a through silicon via (TSV) structure.

BACKGROUND

An image sensor is used in electronic devices to convert optical images into electrical signals. With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras, robots, etc.

In an attempt to achieve the demands of resolution and high-speed operation, multi-layer image sensors have been developed, which include upper layers stacked on lower layers and through silicon via (TSV) structures that are electrically conductive and electrically connect circuits of the upper and lower layers to each other.

SUMMARY

Various embodiments of the disclosed technology relate to an image sensing device including a through silicon via (TSV) structure with improved reliability.

In accordance with an embodiment of the disclosed technology, an image sensing device may include a semiconductor substrate, an insulation layer disposed below the semiconductor substrate, wherein the semiconductor substrate and the insulation layer are structured to form a through hole that penetrates the semiconductor substrate and extends into an inside of the insulation layer, a through silicon via (TSV) structure formed along an inner surface of the through hole, and a photoresist formed over the TSV structure to fill at least a portion of the through hole.

In accordance with another embodiment of the disclosed technology, an image sensing device may include a first substrate including a first front surface and a first back surface opposite to the first front surface, a first interlayer insulation layer disposed below the first front surface, and structured to include a first interconnection structure, a second substrate including a second front surface and a second back surface opposite to the second front surface, a second interlayer insulation layer disposed over the second front surface to be in contact with the first interlayer insulation layer and structured to include a second interconnection structure, a through hole formed to penetrate the first substrate and the first interlayer insulation layer and extending to an inside of the second interlayer insulation layer, a through silicon via (TSV) structure disposed along an inner surface of the through hole and configured to electrically connect the first interconnection structure to the second interconnection structure, and a passivation layer disposed over the TSV structure to fill the through hole.

The passivation layer may include a first photoreactive material layer formed to fill a lower region of the through hole, and a second photoreactive material layer disposed over the first photoreactive material layer in the through hole, and having different photoreaction characteristics from the first photoreactive material layer.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of an image sensing device including a through silicon via (TSV) structure that is formed of an electrically conductive material to provide electrical connections between different layers. The disclosed technology may be used in various ways to substantially address one or more technical or engineering issues and mitigate limitations or disadvantages encountered in some other image sensing devices. Some implementations of the disclosed technology suggest designs of an image sensing device including a through silicon via (TSV) structure with improved reliability. The disclosed technology provides various implementations of an image sensing device which can improve a gap-fill structure for a through silicon via (TSV) region, thereby preventing defects of the through silicon via (TSV) structure when evaluating reliability of THB (Temperature Humidity with Bias) testing.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

Figure 1:
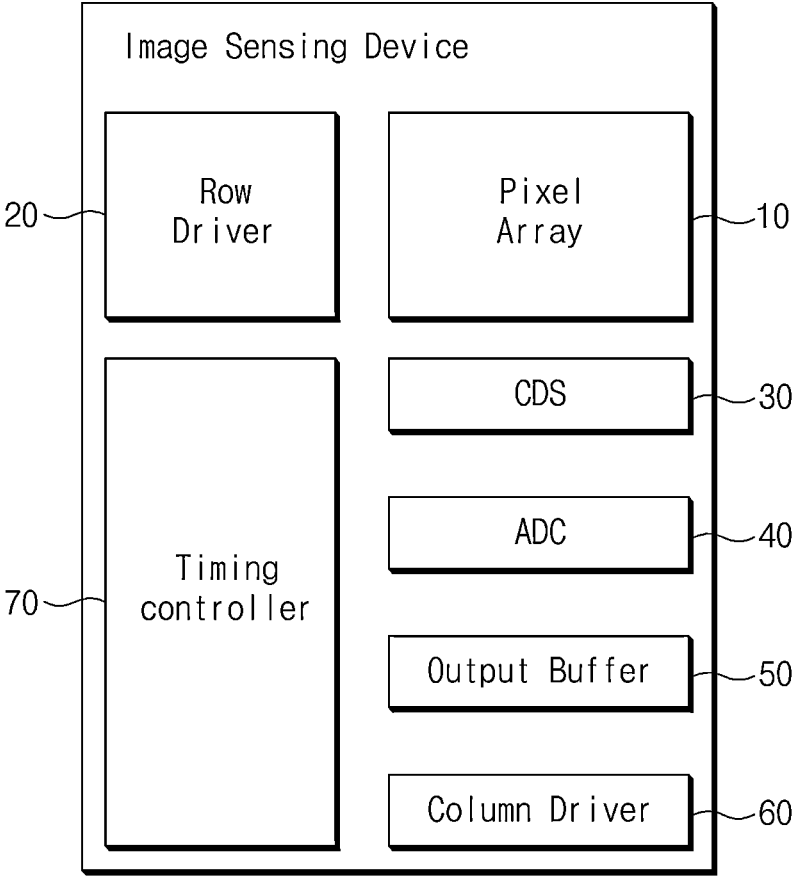
FIG. 1 is a block diagram illustrating an example of an image sensing device based on some implementations of the disclosed technology.

FIG. 1 is a block diagram illustrating an image sensing device based on some implementations of the disclosed technology.

Referring to FIG. 1, the image sensing device may include a pixel array 10, a row driver 20, a correlated double sampler (CDS) 30, an analog-digital converter (ADC) 40, an output buffer 50, a column driver 60 and a timing controller 70. The components of the image sensing device illustrated in FIG. 1 are discussed by way of example only, and this patent document encompasses numerous other changes, substitutions, variations, alterations, and modifications. In this patent document, the word "pixel" can be used to indicate an image sensing pixel that is structured to detect incident light to generate electrical signals carrying images in the incident light, and a phase detection pixel that is structured to generate second electrical signals for calculating a phase difference between the images.

The pixel array 10 may include a plurality of unit pixels arranged in rows and columns. In one example, the plurality of unit pixels can be arranged in a two dimensional (2D) pixel array including rows and columns. In another example, the plurality of unit pixels can be arranged in a three dimensional (3D) pixel array. The plurality of unit pixels may convert an optical signal into an electrical signal on a unit pixel basis or a pixel group basis, where unit pixels in a pixel group share at least certain internal circuitry. The plurality of unit pixels may include a plurality of imaging pixels and a plurality of phase detection pixels. Each of the image pixels may generate an image signal acting as an electrical signal corresponding to a target object to be captured.

The pixel array 10 may receive driving signals (for example, a row selection signal, a reset signal, a transmission (or transfer) signal, etc.) from the row driver 20. Upon receiving the driving signal, the unit pixels may be activated to perform the operations corresponding to the row selection signal, the reset signal, and the transfer signal.

The row driver 20 may activate the pixel array 10 to perform certain operations on the unit pixels in the corresponding row based on control signals provided by controller circuitry such as the timing controller 70. In some implementations, the row driver 20 may select one or more pixel groups arranged in one or more rows of the pixel array 10. The row driver 20 may generate a row selection signal to select one or more rows from among the plurality of rows. The row driver 20 may sequentially enable the reset signal and the transfer signal for the unit pixels arranged in the selected row. The pixel signals generated by the unit pixels arranged in the selected row may be output to the correlated double sampler (CDS) 30.

The correlated double sampler (CDS) 30 may remove undesired offset values of the unit pixels using correlated double sampling. In one example, the correlated double sampler (CDS) 30 may remove the undesired offset values of the unit pixels by comparing output voltages of pixel signals (of the unit pixels) obtained before and after photocharges generated by incident light are accumulated in the sensing node (i.e., a floating diffusion (FD) node). As a result, the CDS 30 may obtain a pixel signal generated only by the incident light without causing noise. In some implementations, upon receiving a clock signal from the timing controller 70, the CDS 30 may sequentially sample and hold voltage levels of the reference signal and the pixel signal, which are provided to each of a plurality of column lines from the pixel array 10. That is, the CDS 30 may sample and hold the voltage levels of the reference signal and the pixel signal which correspond to each of the columns of the pixel array 10. In some implementations, the CDS 30 may transfer the reference signal and the pixel signal of each of the columns as a correlate double sampling (CDS) signal to the ADC 40 based on control signals from the timing controller 70.

The ADC 40 is used to convert analog CDS signals received from the CDS 30 into digital signals. In some implementations, the ADC 40 may be implemented as a ramp-compare type ADC. The analog-to-digital converter (ADC) 40 may compare a ramp signal received from the timing controller 70 with the CDS signal received from the CDS 30, and may thus output a comparison signal indicating the result of comparison between the ramp signal and the CDS signal. The analog-to-digital converter (ADC) 40 may count a level transition time of the comparison signal in response to the ramp signal received from the timing controller 70, and may output a count value indicating the counted level transition time to the output buffer 50.

The output buffer 50 may temporarily store column-based image data provided from the ADC 40 based on control signals of the timing controller 70. The image data received from the ADC 40 may be temporarily stored in the output buffer 50 based on control signals of the timing controller 70. The output buffer 50 may provide an interface to compensate for data rate differences or transmission rate differences between the image sensing device and other devices.

The column driver 60 may select a column of the output buffer 50 upon receiving a control signal from the timing controller 70, and sequentially output the image data, which are temporarily stored in the selected column of the output buffer 50. In some implementations, upon receiving an address signal from the timing controller 70, the column driver 60 may generate a column selection signal based on the address signal, may select a column of the output buffer 50 using the column selection signal, and may control the image data received from the selected column of the output buffer 50 to be output as an output signal.

The timing controller 70 may generate signals for controlling operations of the row driver 20, the ADC 40, the output buffer 50 and the column driver 60. The timing controller 70 may provide the row driver 20, the column driver 60, the ADC 40, and the output buffer 50 with a clock signal required for the operations of the respective components of the image sensing device, a control signal for timing control, and address signals for selecting a row or column. In some implementations, the timing controller 70 may include a logic control circuit, a phase lock loop (PLL) circuit, a timing control circuit, a communication interface circuit and others.

Figure 2:
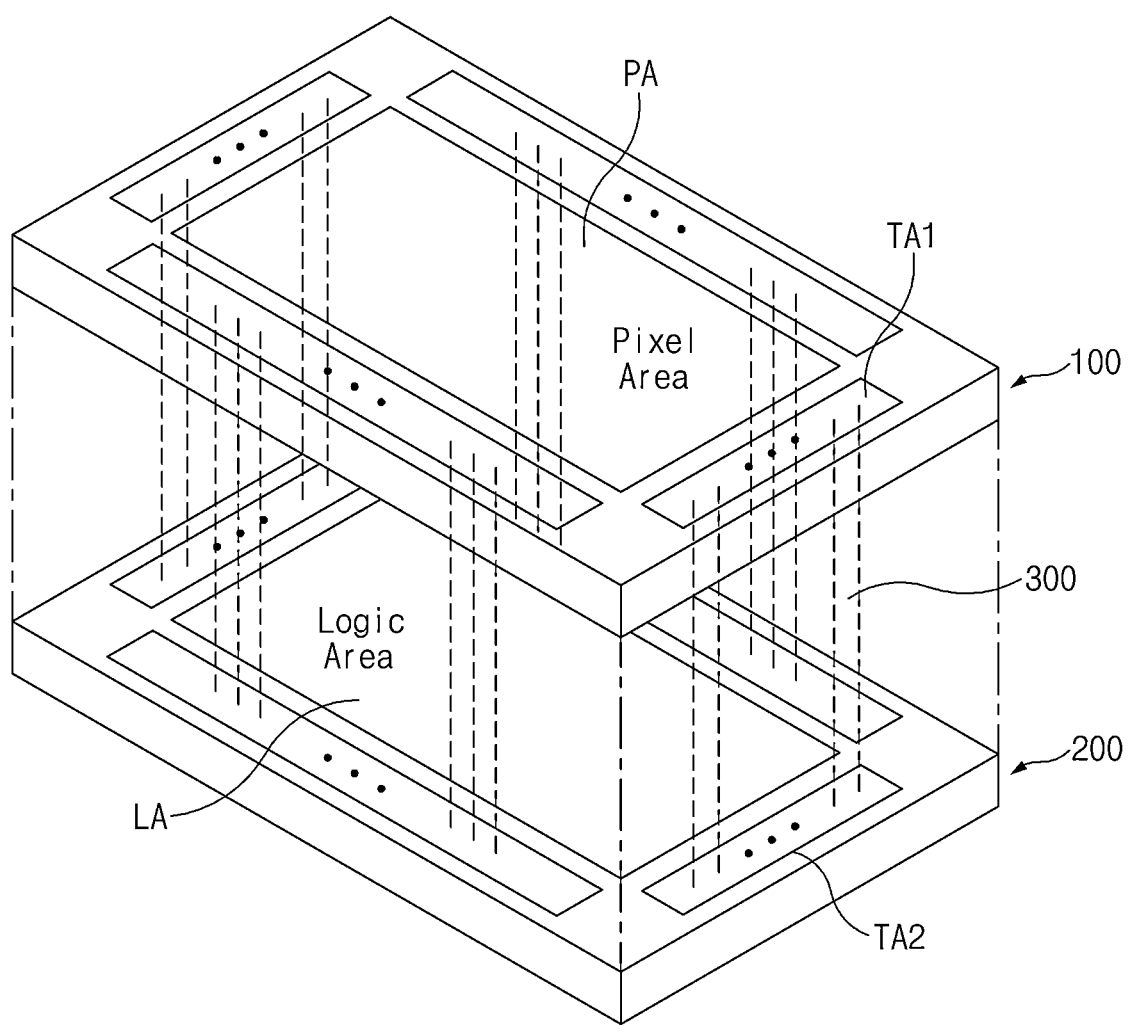
FIG. 2 is a perspective view schematically illustrating an example structure of an image sensing device based on some implementations of the disclosed technology.
Figure 3:
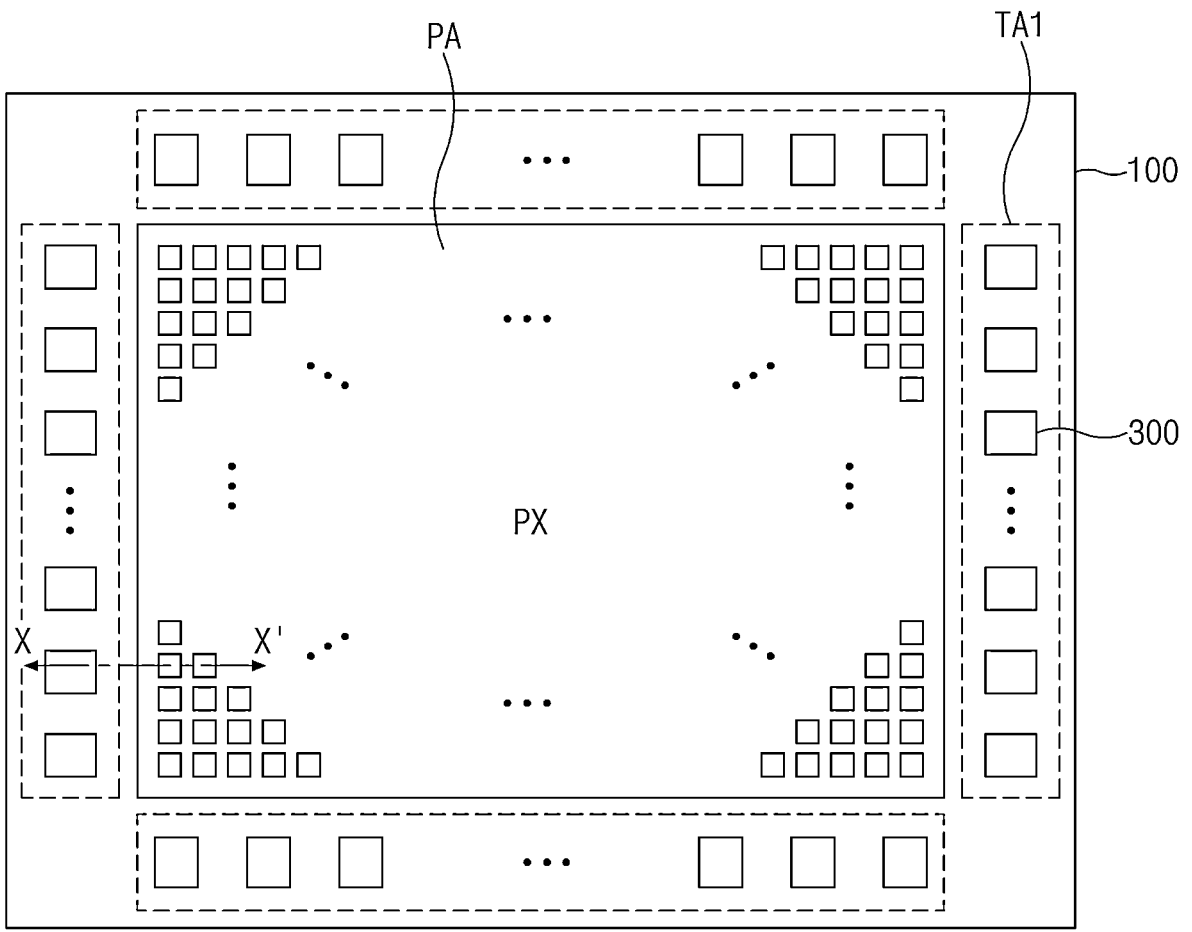
FIG. 3 is a plan view illustrating an example of a planar arrangement structure of a first stacked structure for use in the image sensing device shown in FIG. 2 based on some implementations of the disclosed technology.

FIG. 2 is a perspective view schematically illustrating an example structure of an image sensing device based on some implementations of the disclosed technology. FIG. 3 is a plan view illustrating an example of a planar arrangement structure of a first stacked structure for use in the image sensing device shown in FIG. 2 based on some implementations of the disclosed technology.

Referring to FIGS. 2 and 3, the image sensing device may include a first stacked structure 100, a second stacked structure 200, and a through silicon via (TSV) structure 300 to electrically connect the first and second stacked structures 100 and 200.

The first stacked structure 100 may be disposed over the second stacked structure 200. The first stacked structure 100 may include, in some implementations, a pixel region (PA) in which the pixel array 10 shown in FIG. 1 is formed, and a first TSV region (TA1) located outside the pixel region (PA) for supporting one or more TSVs connecting the first and second stacked structures 100 and 200. In some implementations, the first TSV region (TA1) corresponds to a peripheral region disposed on sides of the pixel region (PA). The pixel region (PA) may be, in some implementations, disposed at a center portion of the first stacked structure 100. The pixel region (PA) may include a plurality of unit pixels (PXs) arranged in rows and columns. Each unit pixel (PX) may include a photoelectric conversion element, a color filter, a microlens, a plurality of pixel transistors. The first TSV region (TA1) may support or include a through silicon via (TSV) structure 300 for electrically connecting the first stacked structure 100 and the second stacked structure 200 to each other or for electrically connecting the first stacked structure 100 and the second stacked structure 200 to an external device. The TSV structure 300 for electrical connection to the external device may be electrically connected to an electrode pad. The first stacked structure 100 may include a first substrate, and a first interconnect layer formed below a surface (i.e., a first front surface) facing the second stacked structure 200 on the first substrate. The first interconnect layer may include an interconnection structure such as metal interconnects which are formed in an interlayer insulation layer. The interconnect of the first stacked structure 100 may be electrically connected to the unit pixels (PXs) and the TSV structure 300. In the first substrate, color filters and microlenses of the unit pixels (PXs) and a pad may be formed over a first back surface opposite to the first front surface of the first substrate.

The second stacked structure 200 may include a logic region (LA) in which the row driver 20, the CDS 30, the ADC 40, the output buffer 50, the column driver 60, and the timing controller 70 shown in FIG. 1 are formed, and a second TSV region (TA2) located outside the logic region (LA). The logic region (LA) may be disposed at a center portion of the second stacked structure 200. The logic region (LA) may include electronic elements (e.g., transistors) that generate control signals to control operations of the unit pixels (PXs) and generate images by processing pixel signals output from the unit pixels (PXs). The second TSV region (TA2) may be formed to vertically overlap with the first TSV region (TA1). A portion of the TSV structure 300 may be formed in the second TSV region (TA2). The second stacked structure 200 may include a second substrate, and a second interconnect layer formed over a surface (i.e., a second front surface) facing the first stacked structure 100 on the second substrate. The first stacked structure 100 and the second stacked structure 200 may be stacked so that the first interconnect layer and the second interconnect layer are in contact with each other. The second interconnect layer may include a structure in which interconnects are formed in the interlayer insulation layer. The interconnect of the second stacked structure 200 may be electrically coupled to electronic elements and the TSV structure 300 so that circuits supported by the second stacked structure 200 and the photoelectric conversion elements supported by the first stacked structure 100 are electrically coupled to allow electrical control and operation of the photoelectric conversion elements in capturing images.

The TSV structure 300 may electrically connect the interconnect formed in the first TSV region (TA1) to the interconnect formed in the second TSV region (TA2) of the second stacked structure 200. For example, the TSV structure 300 may penetrate the first TSV region (TA1) in a vertical direction while being electrically coupled to the interconnect formed in the first TSV region (TA1). In some implementations, the TSV structure 300 may completely penetrate the first TSV region (TA1) in the vertical direction. In some implementations, the TSV structure 300 may penetrate only some regions of the second TSV region (TA2) such that a lower end of the TSV structure 300 can be coupled to the interconnect formed in the second TSV region (TA2). The TSV structure 300 may include a through silicon via (TSV) and a passivation layer for protecting the TSV. The TSV may include a metal material such as tungsten and aluminum, and the passivation layer may include a stacked structure of a photoresist such as an i-line photoresist, a color filter material layer, and a photoresist for a lens. The TSV may be electrically connected to an electrode pad (PAD) for electrical connection to an external device. The structure of the above-described TSV structure 300 will be described later in more detail.

Figure 4:
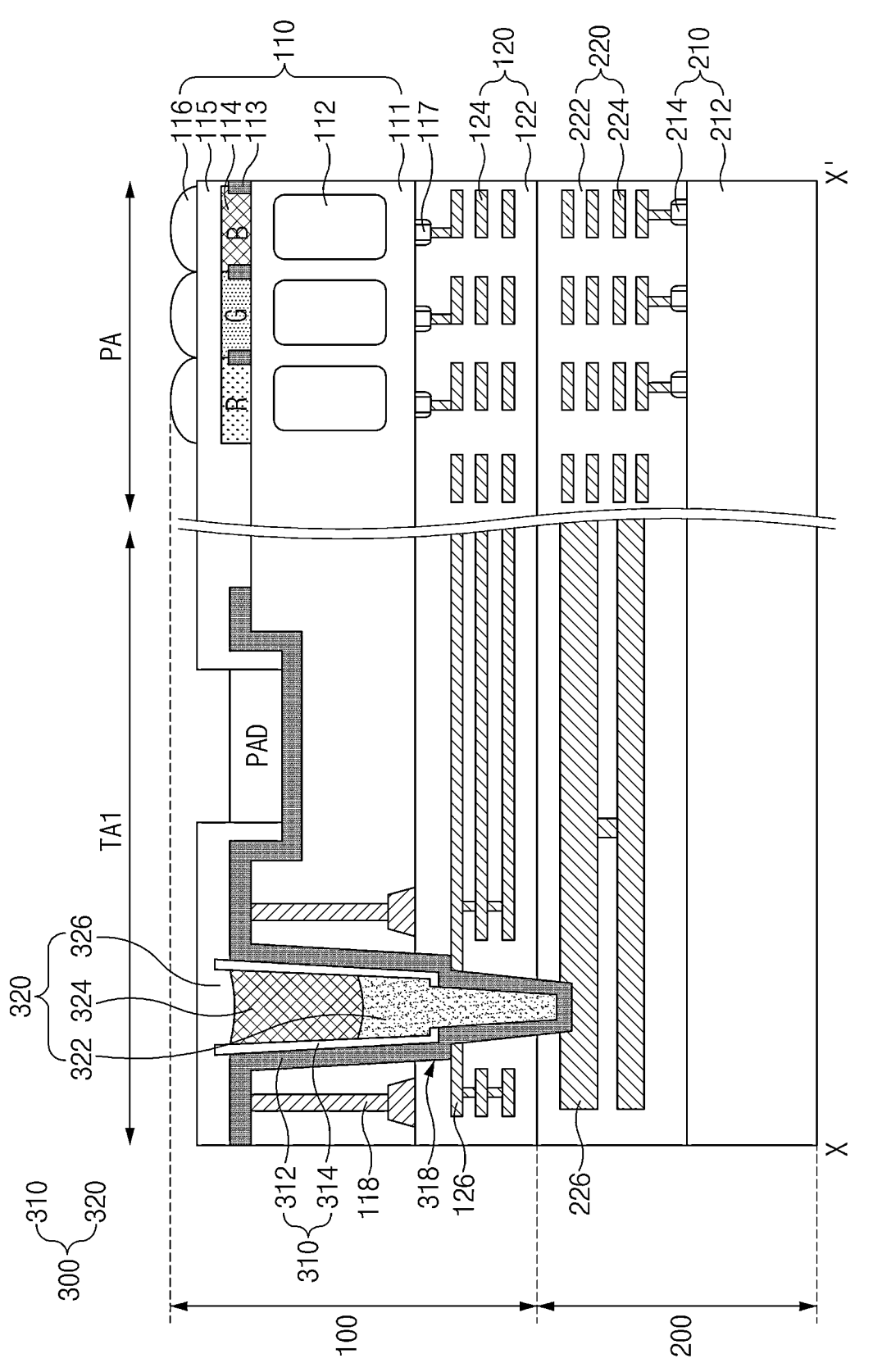
FIG. 4 is a cross-sectional view illustrating an example of a first stacked structure taken along the line X-X' shown in FIG. 3 based on some implementations of the disclosed technology.

FIG. 4 is a cross-sectional view illustrating an example of a first stacked structure 100 taken along the line X-X' shown in FIG. 3 based on some implementations of the disclosed technology.

Referring to FIG. 4, the first stacked structure 100 may include a first substrate layer 110 and a first interconnect layer 120.

The first substrate layer 110 may include a first substrate 111, a photoelectric conversion element 112, a grid structure 113, color filters 114, an over-coating layer 115, microlenses 116, and pixel transistors 117.

The first substrate 111 may include a first front surface and a first back surface opposite to the first front surface. The first back surface of the first substrate 111 may be a light reception surface upon which light is incident, and may be formed to have the color filters 114, the over-coating layer 115, and the microlenses 116 of the unit pixels (PXs). The first front surface of the first substrate 111 may be formed to have pixel transistors 117, and may be in contact with the first interconnect layer 120. Thus, the image sensing device may refer to a backside illuminated (BSI) image sensing device. The first substrate 111 may include a semiconductor substrate. For example, the first substrate 111 may be a bulk-silicon substrate or a silicon-on-insulator (SOI) substrate. Alternatively, the first substrate 111 may be formed of or include an epitaxial layer formed over a base substrate.

A photoelectric conversion element 112 may generate photocharges through photoelectric conversion of incident light received through the first back surface of the first substrate 111. The photoelectric conversion element 112 may be formed in the first substrate 111 to correspond to the unit pixels (PXs) within the pixel region (PA). The photoelectric conversion element 112 may generate photocharges in proportion to the increasing amount of incident light. The photoelectric conversion element 112 may include a photodiode, a phototransistor, a photogate, a pinned photodiode, an organic photodiode, a quantum dot, or a combination thereof, but the disclosed technology is not limited thereto.

The grid structure 113 may be formed between the color filters 114, and may prevent crosstalk between adjacent color filters.

The color filters 114 may be formed over the first back surface in the pixel region (PA). The color filters 114 may be arranged to correspond to the unit pixels, and may filter visible light from incident light. The color filters 114 may include red, green, or blue color filters (R, G, B) arranged in a Bayer pattern. Each of the color filters 114 may include a photoresist dyed with pigments (dye).

The over-coating layer 115 may operate as a planarization layer and configured to remove a step difference between the color filters 114, and may be formed over the color filters 114. The over-coating layer 115 may be formed of or include the same material as the microlenses 116. For example, the over-coating layer 115 may include a light transmissive photoresist.

The microlenses 116 may be formed over the over-coating layer 115 to correspond to the color filters 114. Each of the microlenses 116 may be formed in a convex shape having a predetermined radius of curvature (RoC) to converge incident light onto the photoelectric conversion element 112. Each of the microlenses 116 may include a light transmissive photoresist.

Pixel transistors 117 may be formed over the first front surface of the first substrate 111 so that the pixel transistors 117 are electrically coupled to the first interconnect 124. The pixel transistors 117 may be formed to correspond to the unit pixels (PXs) in the pixel region (PA). The pixel transistors 117 may generate pixel signals corresponding to the amount of photocharges generated by the photoelectric conversion element 112 of the corresponding unit pixel (PX), and may output the pixel signals through the first interconnect 124. The pixel signals output from the pixel region (PA) may be transferred to logic transistors 214 of the logic region (LA) through the first interconnect 124, the TSV 310, and second interconnects 224 and 226. The pixel transistors 117 may include at least one of a transfer transistor, a reset transistor, a source follower transistor, and a select transistor.

The first interconnect layer 120 may be formed under the first front surface of the first substrate 111, and may be formed to contact a second interconnect layer 220 of the second stacked structure 200. The first interconnect layer 120 may include a first interlayer insulation layer 122, and first interconnects 124 formed in the first interlayer insulation layer 122.

In the pixel region (PA) and the first TSV region (TA1), the first interlayer insulation layer 122 may include insulation materials that are disposed among the pixel transistors 117, the TSV 310, and the first interconnects 124. The first interlayer insulation layer 122 may include at least one of silicon oxide, silicon nitride, and silicon oxynitride.

The first interconnects 124 may be formed in the first interlayer insulation layer 122 within the pixel region (PA) and the first TSV region (TA1), and may electrically connect the pixel transistors 117 to the TSV 310. In addition, the first interconnects 124 may electrically interconnect the pixel transistors 117 within the pixel region (PA). The first interconnects 124 may be formed in a multilayer structure.

The second stacked structure 200 may include a second substrate layer 210 and a second interconnect layer 220.

The second substrate layer 210 may include a second substrate 212 and a plurality of logic transistors 214.

The second substrate 212 may include a second front surface and a second back surface opposite to the second front surface. The second front surface of the second substrate 212 may be a surface on which the logic transistors are formed, and may be in contact with the second interconnect layer 220. The second substrate 212 may include a semiconductor substrate such as a first substrate.

The logic transistors 214 may be formed over a second front surface of the second substrate 212 such that the logic transistors 214 can be coupled to the second interconnects 224. The logic transistors 214 may generate control signals to control operations of the unit pixels (PXs), and may process the pixel signals output from the unit pixels (PXs), resulting in formation of an image. For example, the logic transistors 214 may include transistors configured to construct the row driver 20, the CDS 30, the ADC 40, the output buffer 50, the column driver 60, and the timing controller 70 shown in FIG. 1. The logic transistors 214 may be formed in the logic region (LA) within the second substrate 212. The logic transistors 214 may receive pixel signals from the unit pixels (PXs) through the first interconnects 124, the TSV 310, and the second interconnects 224.

The second interconnect layer 220 may be formed over the second front surface of the second substrate 212, and may be formed to contact the first interconnect layer 120 of the first stacked structure 100. The second interconnect layer 220 may include a second interlayer insulation layer 222, and second interconnects 224 formed in the second interlayer insulation layer 222.

In the logic region (LA) and the second TSV region (TA2), the second interlayer insulation layer 222 may include insulation materials that are disposed among the logic transistors 214, the TSV 310, and the second interconnects 224. The second interlayer insulation layer 222 may include at least one of silicon oxide, silicon nitride, and silicon oxynitride.

The second interconnects 224 may be formed in the second interlayer insulation layer 222 within each of the logic region (LA) and the second TSV region (TA2), and may electrically connect the logic transistors 214 to the TSV 310. In addition, the second interconnects 224 may electrically connect the logic transistors 214 to each other within the logic region (LA). The second interconnects 224 may be formed in a multilayer structure. Among the second interconnects 224, the interconnects 226 contacting a lower end of the TSV 310 may be formed to be thicker than other interconnects.

The TSV structure 300 may include a TSV 310 and a passivation layer 320.

The TSV 310 may electrically connect the interconnects 126 formed in the first interconnect layer 120 to the interconnects 226 formed in the second interconnect layer 220. The TSV 310 may include at least one of a metal, a metal silicide, or a metal compound. In some implementations, the TSV 310 may include an electrically conductive material which can be a metal such as tungsten (W), aluminum (Al) or other metals. For example, in the first TSV region (TA1), the first substrate 111 and the first interlayer insulation layer 122 may be penetrated to expose the TSV pad 126. In the second TSV region (TA2), a portion of the second interlayer insulation layer 222 may be etched to form a through hole 318 exposing the interconnects 226, and a metal material may be formed to conformally extend along the inner surface (e.g., side and bottom surfaces) of the through hole 318, resulting in formation of the TSV 310. Although the through hole 318 is described, other implementations are also possible as long as it has an opening in the first interconnect layer 120 that allows to form the TSV 310. The TSV 310 may be formed in a stacked structure of two different metal layers in contact with each other such as a tungsten layer 312 and an aluminum layer 314 as illustrated. In FIG. 4, although the tungsten layer 312 and the aluminum layer 314 are disposed in only on a portion (i.e., the upper portion of the TSV pad 126) of the TSV 310, other implementations are also possible. For example, the tungsten layer 312 and the aluminum layer 314 may be stacked entirely within the through hole 318.

The TSV 310 may extend to the first back surface of the first substrate 111, and may be coupled to an electrode pad (PAD). For example, the tungsten layer 312 of the TSV 310 may be formed to extend a predetermined distance on the first back surface of the first substrate 111, and the electrode pad (PAD) may be formed over the extended tungsten layer 312. The electrode pad (PAD) may include aluminum (Al).

Although FIG. 4 shows a structure in which the TSV structure 300 is coupled to the electrode pad (PAD), the TSV structure 300 may be formed to connect the interconnects 126 of the first stacked structure 100 to the interconnects 226 of the second stacked structure 200 without being connected to the electrode pad (PAD). Thus, the TSV structure 300 may be used for electrical connection between the stacked structures 100 and 200 only inside the image sensing device rather than for connection to an external device.

The passivation layer 320 may protect the TSV 310 from the external environment (e.g., temperature, moisture, etc.), and may be formed over the TSV 310 to cover the TSV 310 while filling the through hole 318. For example, the passivation layer 320 may be formed over the TSV 310 to fill the through hole 318. In some implementations, in order to prevent the TSV (especially, the tungsten layer) 310 from being unfastened due to occurrence of a void in the passivation layer 320, the lower region of the passivation layer 320 may include the i-line material layer 322 formed of or include a photoreactive material. The i-line material layer 322 may include a positive-type photoresist such as a positive-type i-line photoresist that reacts to light having a wavelength of 365 nm.

The i-line material layer 322 may be formed over the TSV 310 to gap-fill the lower region of the through hole 318 by a predetermined height. For example, the i-line material layer 322 may be formed over the TSV 310 so that the through hole 318 is gap-filled to a position of at least 50% of the height of the through hole 318. The gap-filling is described as one example to fill the through hole 318 and other implementations are also possible in filling the through hole 318.

The image sensing device may be manufactured as a module, and THB (Temperature Humidity with Bias) reliability evaluation may be performed by sampling some products. When there is a gap-fill defect (e.g., a void) in the passivation layer 320, a portion close to a specific portion where the gap-fill defect has occurred among the TSVs 310 becomes unfastened (comes off), resulting in occurrence of a THB (Temperature Humidity with Bias) failure. In particular, when the TSV 310 of a portion contacting the interconnects 126 and 226 becomes unfastened (comes off) in the lower region of the through hole 318, the TSV structure 300 cannot properly perform the original function thereof due to poor contact with the interconnects 126 and 226. In order to address this issue, the lower region of the passivation layer 320 may be formed of or include the i-line material layer 322 having excellent gap-fill characteristics.

A blue color filter material layer 324 and a lens photoresist 326 may be sequentially formed over the i-line material layer 322. Thus, the passivation layer 320 based on some implementations of the disclosed technology may include a structure in which the i-line material layer 322, the color filter material layer 324, and the photoresist for lens (hereinafter referred to as a lens photoresist) 326 are sequentially stacked.

The color filter material layer 324 may include the same material as the color filter of the pixel region (PA) as a photoreactive material. For example, the color filter material layer 324 may be formed of or include the same material as the blue color filter (B) of the pixel region (PA). Accordingly, the color filter material layer 324 may be formed together with formation of the blue color filter (B) in the pixel region (PA). The color filter material layer 324 may include a negative-type photoresist including a blue dye.

The lens photoresist 326 may be formed of or include the same material as the over-coating layer 115 used as a planarization layer for forming the microlenses 116 in the pixel region (PA), and may be formed together with formation of the over-coating layer 115 in the pixel region (PA). The lens photoresist 326 may be formed to entirely cover the color filter material layer 324 and the TSV 310 while exposing the top surface of the electrode pad (PAD) in the first TSV region (TA1).

Although FIG. 4 shows an embodiment in which the color filter material layer 324 is formed over the i-line material layer 322 for convenience of description, the i-line material layer 322 instead of the color filter material layer 324 may also be formed in the corresponding region. For example, the i-line material layer 322 may be formed entirely in the through hole 318, and the lens photoresist 326 may be formed over the i-line material layer 322.

A device isolation pattern 118 for isolating the TSV structure 300 and the pixel region PA from each other may be formed over a side surface of the TSV structure 300 in the first substrate 111. The device isolation pattern 118 may include a structure in which an insulation material is embedded in a device isolation trench (not shown). For example, as shown in FIG. 4, the device isolation pattern 118 may include a structure in which a deep trench isolation (DTI) structure and a shallow trench isolation (STI) structure are stacked.

FIGS. 5 to 12 are cross-sectional views illustrating examples of a method for forming the TSV structure shown in FIG. 4 based on some implementations of the disclosed technology.

Figure 5:
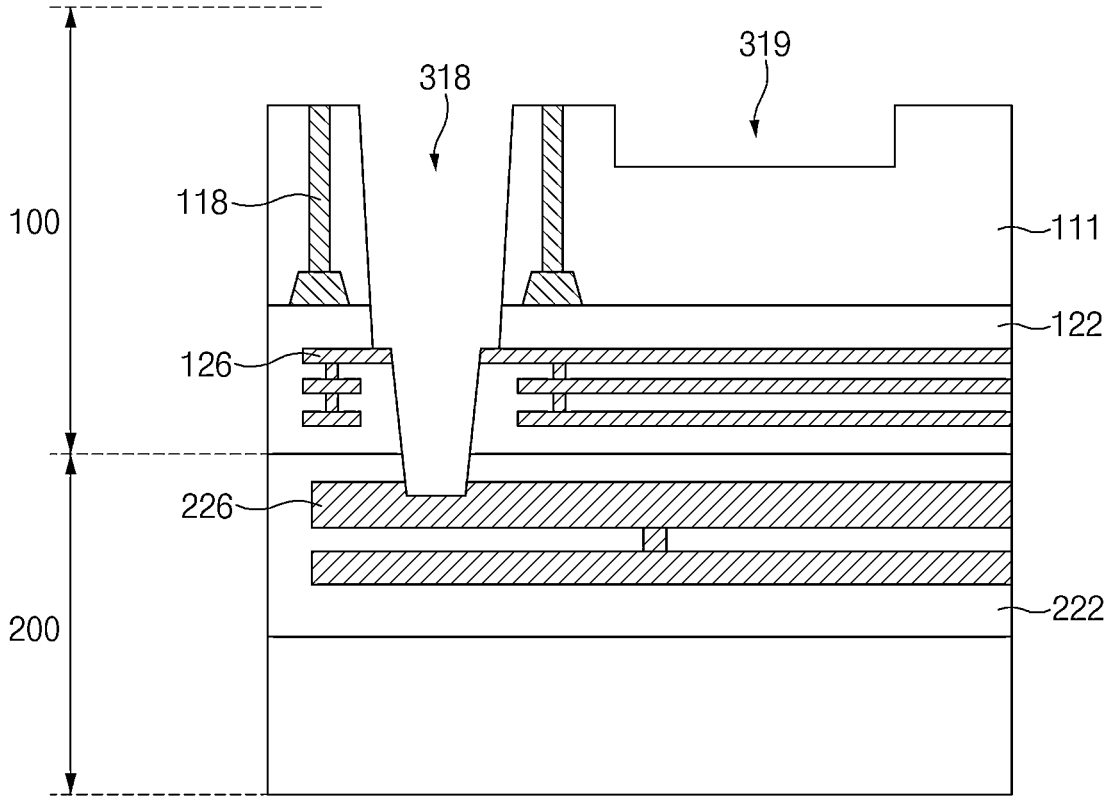
FIGS. 5 to 12 are cross-sectional views illustrating examples of a method for forming the TSV structure shown in FIG. 4 based on some implementations of the disclosed technology.

Referring to FIG. 5, the first stacked structure 100 and the second stacked structure 200 may be bonded such that the first interlayer insulation layer 122 and the second interlayer insulation layer 222 are in contact with each other.

Subsequently, the first substrate 111 and the first interlayer insulation layer 122 that are disposed between the device isolation patterns 118 in the first TSV region (TA1) may be etched until the TSV pad 126 is exposed. Then, the first interlayer insulation layer 122 and the second interlayer insulation layer 222 may be etched until the interconnect 226 is exposed using the TSV pad 126 as an etch mask, resulting in formation of a through hole 318.

Then, a trench 319 for a pad (hereinafter referred to as a pad trench) may be formed by etching the first substrate 111 of the region where the electrode pad is to be formed to a predetermined depth. The pad trench 319 may be formed before the through hole 318 is formed, or may be formed together with formation of the through hole 318.

Figure 6:
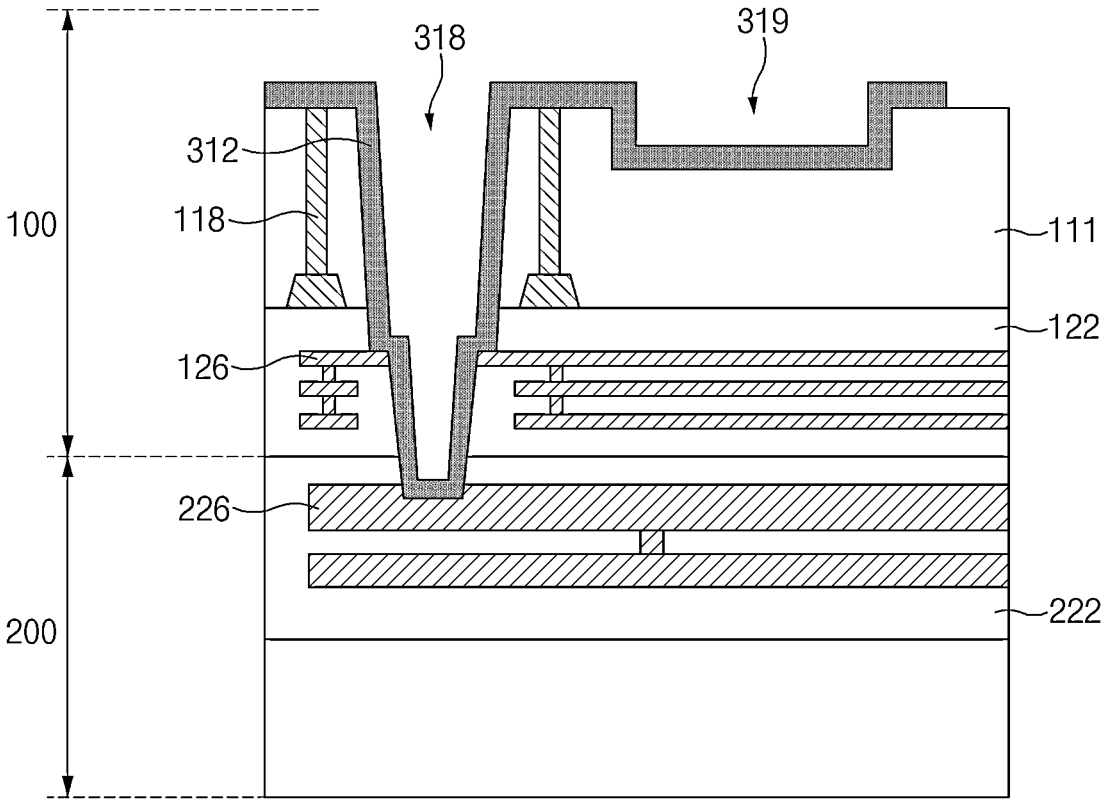

Referring to FIG. 6, a conductive layer 312 for the first TSV (hereinafter referred to as a first TSV conductive layer 312) may be formed over the first back surface of the first substrate 111 and the inner surface (e.g., an inner side surface and a bottom surface) of the through hole 318. The first TSV conductive layer 312 may be formed to have a constant thickness on the inner side surface and the bottom surface of the through hole 318, and may be formed to extend from the first back surface to the pad trench 319. That is, the first TSV conductive layer 312 may also electrically connect the TSV structure 300 to the electrode pad (PAD). The first TSV conductive layer 312 may include any one selected from the group consisting of a metal, a metal silicide, or a metal compound. For example, the first TSV conductive layer 312 may include tungsten (W).

Figure 7:
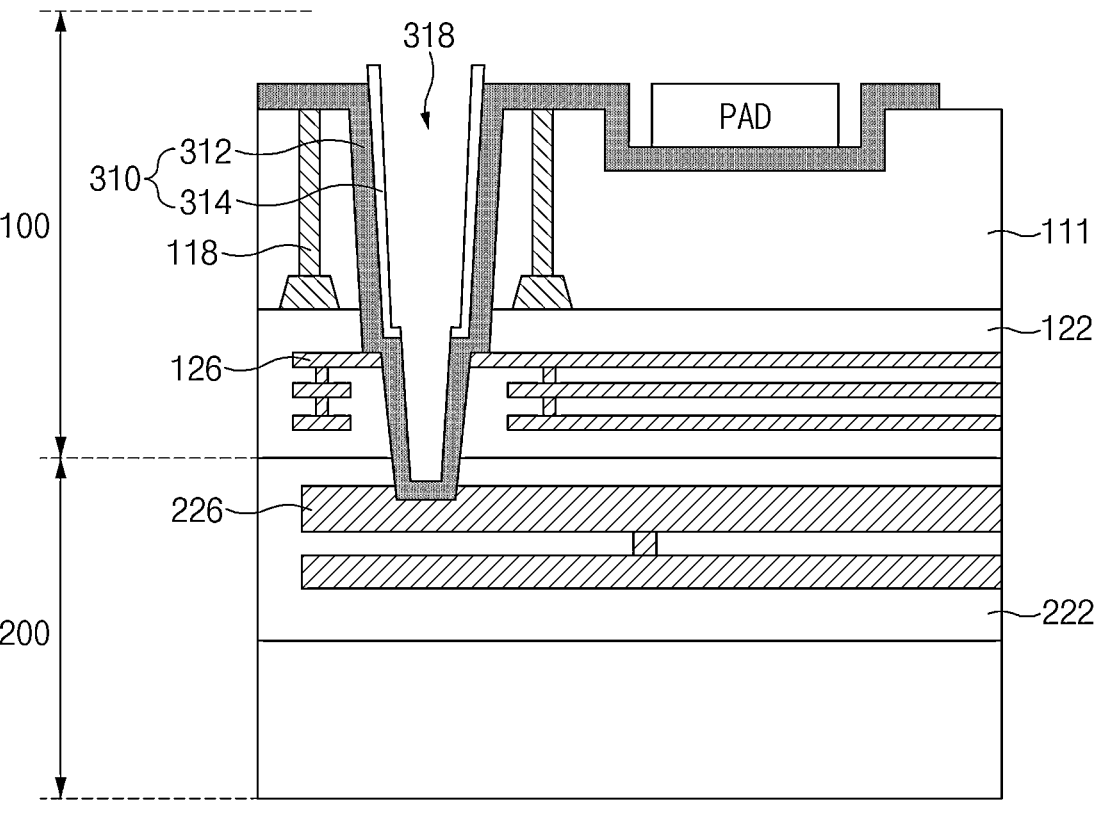

Referring to FIG. 7, a conductive layer 314 for a second TSV (hereinafter referred to as a second TSV conductive layer 314) may be formed over the first TSV conductive layer 312 in the through hole 318, and the electrode pad (PAD) may be formed over the first TSV conductive layer 312 in a trench 319 for a pad (hereinafter referred to as a pad trench 319). Although FIG. 7 shows that the second TSV conductive layer 314 is partially formed over the first TSV conductive layer 312 in the through hole 318 for convenience of description, the second TSV conductive layer 314 may be formed entirely to cover the first TSV conductive layer 312 within the through hole 318. The second TSV conductive layer 314 and the electrode pad (PAD) may include aluminum (Al).

Figure 8:
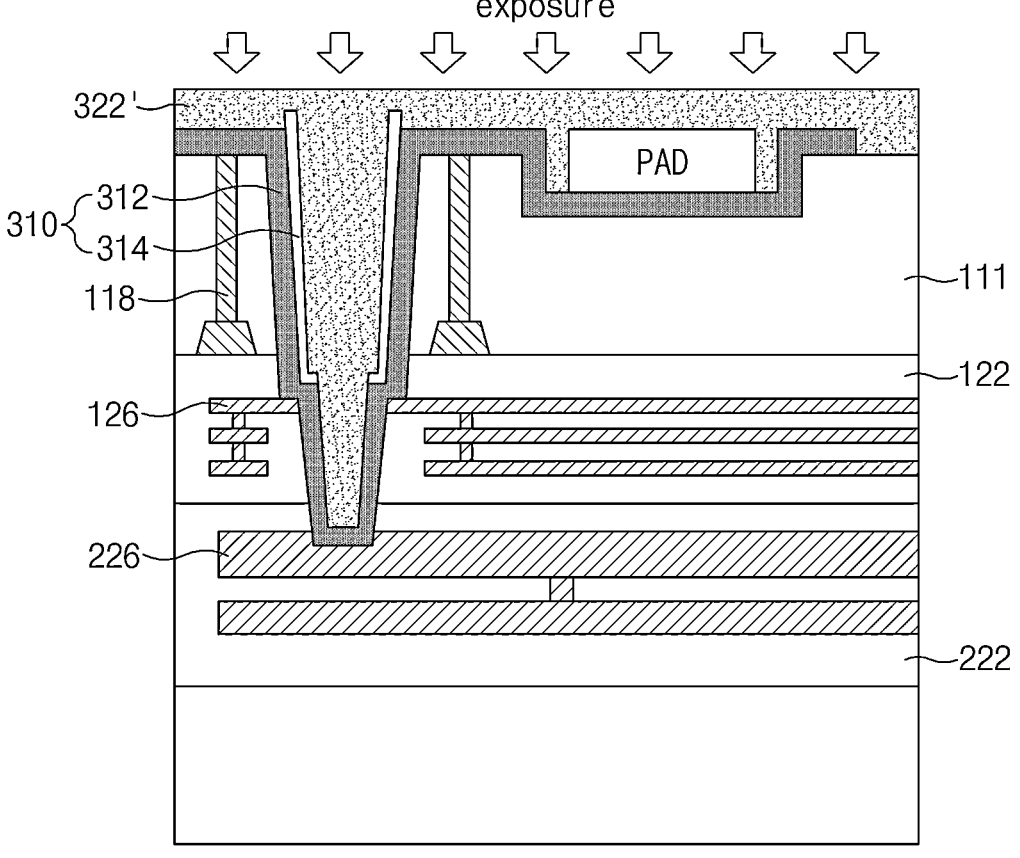

Referring to FIG. 8, an i-line material layer 322' may be formed over the entire first back surface of the first substrate 111 to fill the through hole 318. The i-line material layer 322' may include a positive-type i-line photoresist.

Subsequently, an exposure process may be performed on the i-line material layer 322' such that the i-line material layer 322' remains at a predetermined height only in the lower region of the through hole 318. For example, since the i-line material layer 322' based on some implementations of the disclosed technology is formed of or include a positive-type material, a portion exposed to light may be removed in a subsequent development process. Therefore, during the exposure process, light having a wavelength of 365 nm may be irradiated onto the entire wafer using a blank reticle When the exposure time is adjusted in a situation where the through hole 318 has a large depth, whereas the i-line material layer 322' formed over the first back surface of the first substrate 111 and the i-line material layer 322' formed in the upper region of the through hole 318 are exposed to light, the i-line material layer 332' formed in the lower region of the through hole 318 may not be exposed to light. Accordingly, during a subsequent development process, the i-line material layer 322' can remain at a predetermined height only in the lower region of the through hole 318, and at the same time all of the i-line material layer 322' can be removed from the remaining regions. The exposure time may be adjusted based on the type and thickness of the i-line material layer 322'.

Figure 9:
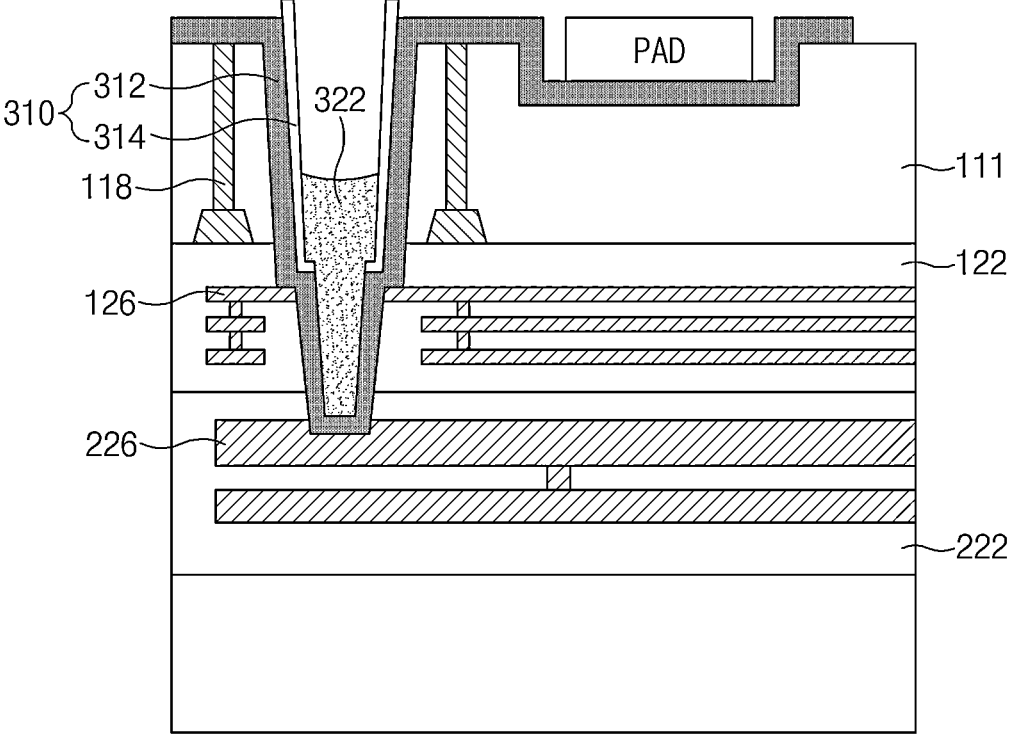

Referring to FIG. 9, a development process may be performed on the exposed i-line material layer 322 such that the i-line material layer 322 can be formed at a predetermined height only in the lower region of the through hole 318, and all of the i-line material layer 322' can be removed from the remaining regions. For example, the i-line material layer 322 may remain at a height of at least 50% of the through hole 318, and at the same time the i-line material layer 322 may not completely fill the through hole 318.

Alternatively, the i-line material layer 322 may be formed to fill the entirety of the through hole 318. In this case, since a coating contact angle increases when a mask process for the color filters is performed in a subsequent process, poor coatability may occur. Thus, it is preferable that the through hole 318 be prevented from being fully filled with the i-line material layer 322.

Then, the i-line material layer 322 may be hardened and stabilized by performing a baking process of the remaining i-line material layer 322, so that adhesion of the i-line material layer 322 can be improved. In this case, the baking process may be performed for about 180 seconds at a temperature of about 200 to 240° C. (preferably 220° C.).

Figure 10:
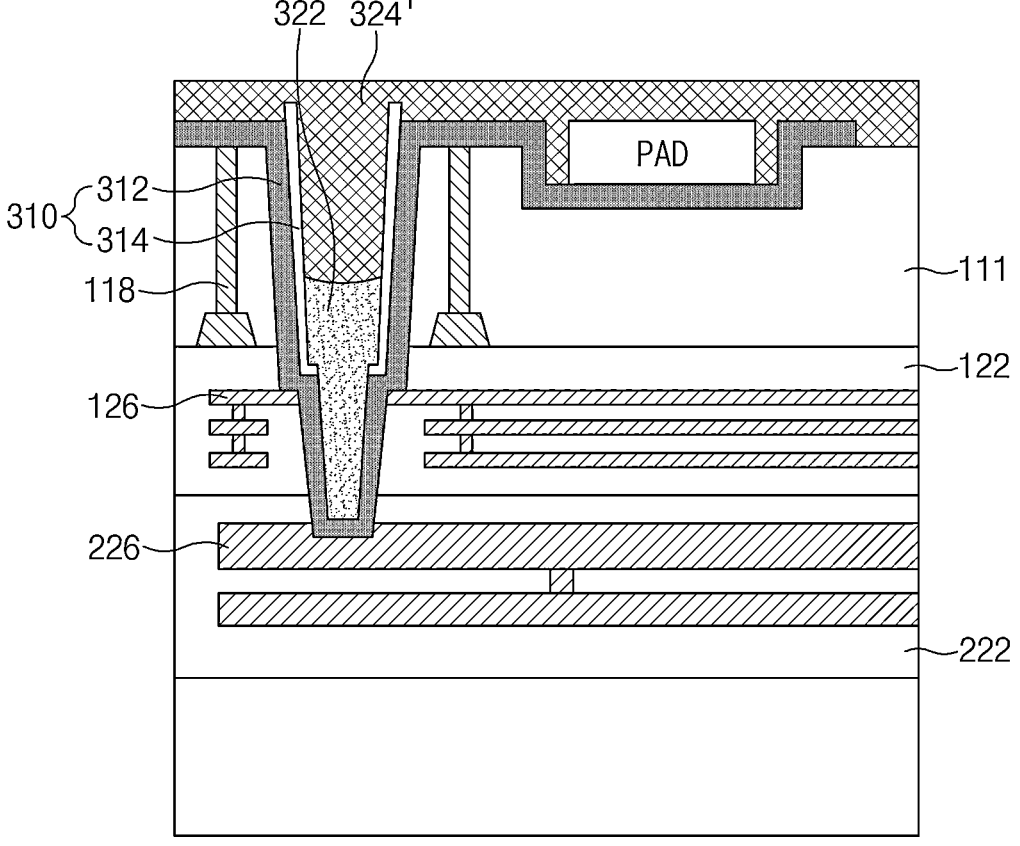

Referring to FIG. 10, a color filter material layer 324' may be formed over the first back surface of the first substrate 111 to fill the through hole 318.

The color filter material layer 324' may include the same material as the blue color filter (B) among the color filters (R, G, B) formed in the pixel region (PA). For example, the color filter material layer 324' may be a photoresist containing a blue colorant (dye).

Accordingly, the color filter material layer 324' may be formed together with coating of the blue color material layer on the first back surface of the first substrate 111 to form a blue color filter (B) in the pixel region (PA).

Figure 11:
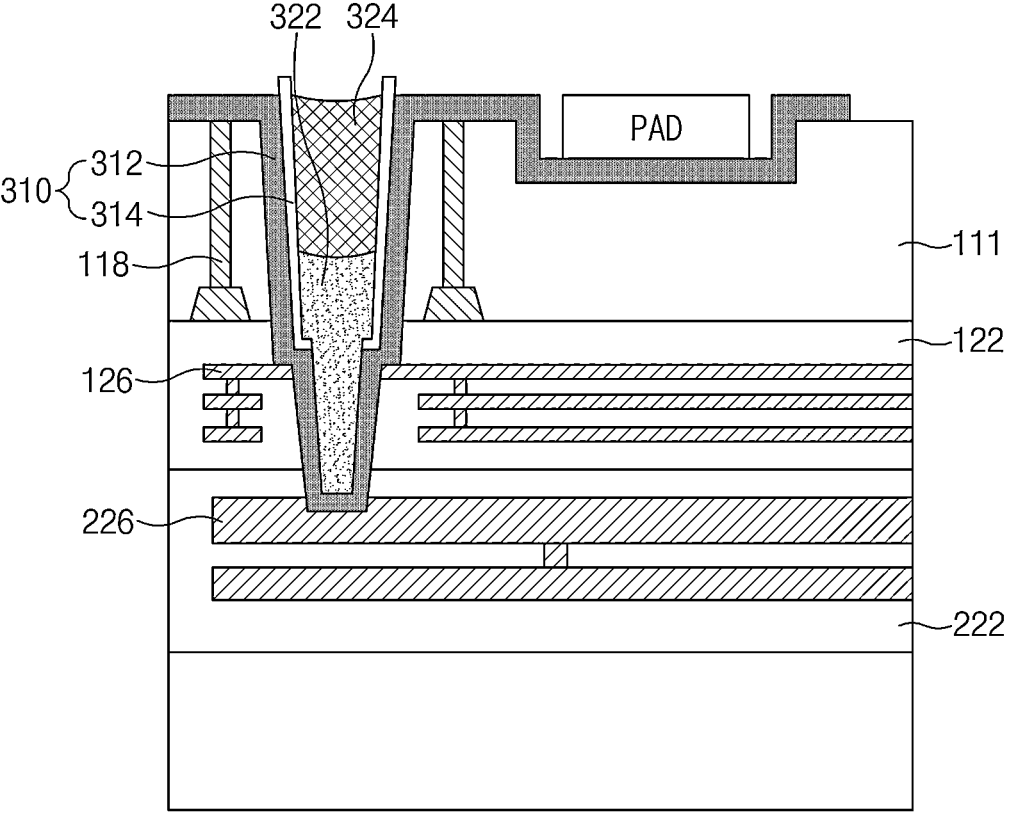

Referring to FIG. 11, an exposure and development process may be performed on the color filter material layer 324' so that the color filter material layer 324 can be formed over the i-line material layer 322 in the through hole 318. For example, since the color filter material layer 324' is formed of or include a negative-type material, only a portion exposed to light remains unused and the remaining portions other than this exposed portion is removed in a subsequent development process, so that only the region of the through hole 318 within the first TSV region (TA1) can be exposed to light. As a result, the color filter material layer 324 can be formed over the i-line material layer 322.

Figure 12:
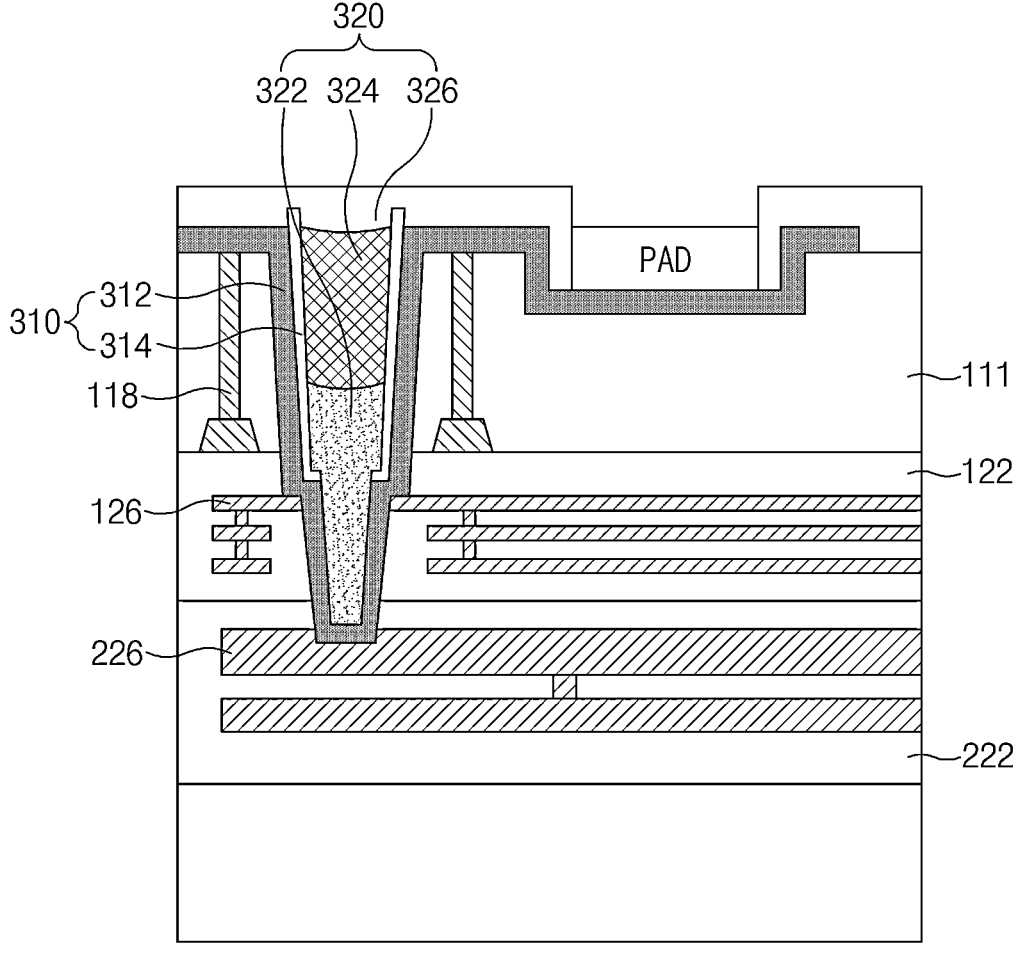

Referring to FIG. 12, the lens photoresist 326 may be formed over the TSV 310 and the color filter material layer 324.

The lens photoresist 326 may be formed of or include the same material as the over-coating layer 115 that is used as a planarization layer in the pixel region (PA). Thus, the lens photoresist 326 may be formed together when the over-coating layer 115 is formed in the pixel region (PA). The lens photoresist 326 may be formed to expose only the top surface of the electrode pad (PAD) in the first TSV region (TA1) and to completely cover the TSV 310 and the color filter material layer 324.

As is apparent from the above description, the image sensing device based on some implementations of the disclosed technology can improve a gapfill structure for a through silicon via (TSV) region, thereby preventing defects of a through silicon via (TSV) structure when evaluating reliability of THB (Temperature Humidity with Bias) testing.

The embodiments of the disclosed technology may provide a variety of effects capable of being directly or indirectly recognized through the above-mentioned patent document.

Although a number of illustrative embodiments of the disclosed technology have been described, various modifications or enhancements to the disclosed embodiments and other embodiments can be devised based on what is described and/or illustrated in this patent document.

What is claimed is:

1. An image sensing device comprising:
   a semiconductor substrate;
   an insulation layer disposed below the semiconductor substrate, wherein the semiconductor substrate and the insulation layer are structured to form a through hole that penetrates the semiconductor substrate and extends into an inside of the insulation layer;
   a through silicon via (TSV) structure formed along an inner surface of the through hole;
   a photoresist formed over the TSV structure to fill at least a portion of the through hole; and
   a color filter material layer disposed over the photoresist within the through hole.

2. The image sensing device according to claim 1, wherein:

the photoresist is formed to gap-fill the through hole to a height of at least 50% of a height of the through hole without completely gap-filling the through hole.

3. The image sensing device according to claim 1, wherein:

the photoresist includes a positive-type photoresist.

4. The image sensing device according to claim 1, wherein:

the color filter material layer includes a negative-type photoresist having a blue dye.

5. The image sensing device according to claim 1, wherein:

the color filter material layer includes a same material as a blue color filter of a pixel region including one or more photoelectronic conversion elements in the semiconductor substrate.

6. An image sensing device comprising:

a first substrate including a first front surface and a first back surface opposite to the first front surface;

a first interlayer insulation layer disposed below the first front surface, and structured to include a first interconnection structure;

a second substrate including a second front surface and a second back surface opposite to the second front surface;

a second interlayer insulation layer disposed over the second front surface to be in contact with the first interlayer insulation layer, and structured to include a second interconnection structure;

a through hole formed to penetrate the first substrate and the first interlayer insulation layer and extending to an inside of the second interlayer insulation layer;

a through silicon via (TSV) structure disposed along an inner surface of the through hole and configured to electrically connect the first interconnection structure to the second interconnection structure; and a passivation layer disposed over the TSV structure to fill the through hole;

wherein the passivation layer includes:

a first photoreactive material layer formed to fill a lower region of the through hole; and a second photoreactive material layer disposed over the first photoreactive material layer in the through hole, and having different photoreaction characteristics from the first photoreactive material layer.

7. The image sensing device according to claim 6, wherein:

the first photoreactive material layer includes a positive-type photoresist.

8. The image sensing device according to claim 7, wherein:

the first photoreactive material layer includes an i-line photoresist.

9. The image sensing device according to claim 6, wherein:

the first photoreactive material layer is formed to fill the through hole to a height of at least 50% of a height of the through hole without completely filling the through hole.

10. The image sensing device according to claim 6, wherein:

the second photoreactive material layer includes a negative-type photoresist.

11. The image sensing device according to claim 6, wherein:

the second photoreactive material layer includes a photoresist having a blue dye.

12. The image sensing device according to claim 6, wherein:

the second photoreactive material layer includes a same material as a blue color filter of a pixel region including one or more photoelectronic conversion elements in the first substrate.

13. The image sensing device according to claim 6, wherein the passivation layer further includes:

a third photoreactive material layer formed to cover the through silicon via (TSV) structure and the second photoreactive material layer.

14. The image sensing device according to claim 13, wherein:

the third photoreactive material layer includes a photoresist for a lens.

15. The image sensing device according to claim 14, wherein:

the third photoreactive material layer includes a same material as an over-coating layer that is disposed between color filters and microlenses and configured to remove a step difference between the color filters within a pixel region including one or more photoelectronic conversion elements in the first substrate.

16. The image sensing device according to claim 6, further comprising:

an electrode pad formed over the first back surface and configured to provide an electrical connection to an external device.

17. The image sensing device according to claim 16, wherein:

the through silicon via (TSV) structure extends to the first back surface and is electrically connected to the electrode pad.

18. The image sensing device according to claim 6, wherein the through silicon via (TSV) structure includes:

a first metal layer formed to conformally extend along the inner surface of the through hole; and a second metal layer disposed over the first metal layer and being in contact with the first photoreactive material layer and the second photoreactive material layer.

19. The image sensing device according to claim 18, wherein the first photoreactive material layer includes a first region in contact with the first metal layer, and a second region disposed over the first region and in contact with the second metal layer.

* * * * *